Figure 1:
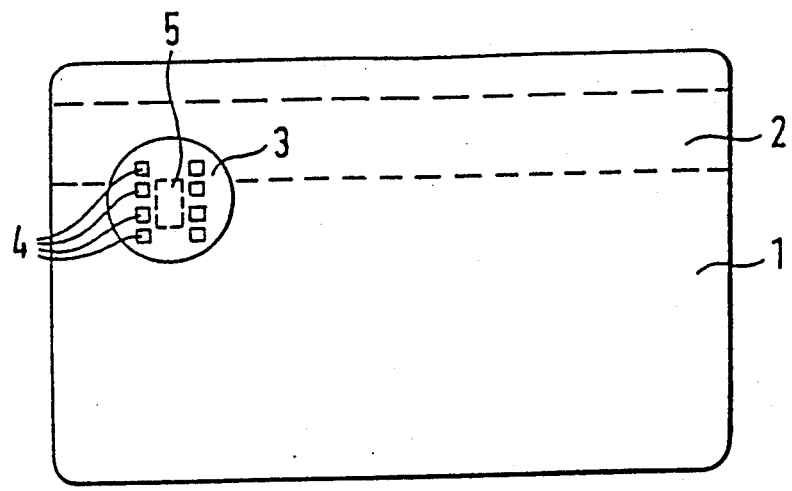

United States Patent [19]

Hoppe

[11] Patent Number: 5,013,900
[45] Date of Patent: * May 7, 1991

[54] IDENTIFICATION CARD WITH INTEGRATED CIRCUIT

[75] Inventor: Joachim Hoppe, Munich, Fed. Rep. of Germany

[73] Assignee: GAO Gesellschaft fur Automation und Organisation mbH, Fed. Rep. of Germany

[*] Notice: The portion of the term of this patent subsequent to Jun. 27, 2006 has been disclaimed.

[21] Appl. No.: 299,654

[22] Filed: Jan. 23, 1989

Related U.S. Application Data

[60] Continuation of Ser. No. 53,040, May 22, 1987, Pat. No. 4,843,225, which is a division of Ser. No. 910,351, Sep. 24, 1986, Pat. No. 4,746,392, which is a continuation of Ser. No. 562,217, Dec. 16, 1983, abandoned.

[30] Foreign Application Priority Data

Dec. 28, 1982 [DE] Fed. Rep. of Germany ....... 3248385

[51] Int. Cl.$^5$ ............................................ G06K 19/00
[52] U.S. Cl. ..................................... 235/492; 357/72; 357/74; 235/487
[58] Field of Search .................. 235/487, 488, 492; 357/72, 79, 84; 283/83

[56] References Cited

U.S. PATENT DOCUMENTS

| | | | |
|---|---|---|---|
| 3,206,647 | 9/1965 | Kahn | 357/72 |
| 3,622,419 | 11/1971 | London | 156/293 |
| 3,702,464 | 11/1972 | Castrucci | 235/492 |
| 3,778,685 | 12/1973 | Kennedy | 357/72 X |
| 4,079,511 | 3/1978 | Grabbe | 29/827 |
| 4,216,577 | 8/1980 | Badet et al. | 264/272.17 X |
| 4,222,516 | 9/1980 | Badet et al. | 235/492 |
| 4,297,570 | 10/1981 | Kowalski et al. | 235/493 |
| 4,380,699 | 4/1983 | Monnier et al. | 235/492 |
| 4,417,413 | 11/1983 | Hoppe et al. | 40/613 |
| 4,460,825 | 7/1984 | Haghiri-Tehrani et al. | 235/488 |
| 4,463,971 | 8/1984 | Hopp et al. | 283/83 |
| 4,474,292 | 10/1984 | Haghiri-Tehrani et al. | |
| 4,549,247 | 10/1985 | Hoppe et al. | 361/398 |
| 4,746,392 | 5/1988 | Hopp | 156/244.12 |
| 4,843,225 | 7/1959 | Hoppe | 235/492 |

FOREIGN PATENT DOCUMENTS

| | | |
|---|---|---|
| 2220721 | 11/1972 | Fed. Rep. of Germany . |
| 3029939 | 11/1972 | Fed. Rep. of Germany . |
| 2734439 | 2/1978 | Fed. Rep. of Germany . |
| 2920012 | 11/1980 | Fed. Rep. of Germany . |
| 58-21850 | 2/1983 | Japan ............................. 357/72 |
| 58-5844 | 6/1983 | Japan ............................. 357/72 |
| 2081644 | 2/1982 | United Kingdom . |
| 2081950 | 2/1982 | United Kingdom ........... 283/83 |
| 2090466 | 7/1982 | United Kingdom . |

OTHER PUBLICATIONS

"A Plastic Computer for your Wallet", USA Today, Dec. 5, 1983, pp. 1–2.
Handbook of Material Tradenames, Suppl. IV to 1953 ed., Dover, Ind., Industrial Research Service, 1965, pp. 320–321.

*Primary Examiner*—A. D. Pellinen
*Assistant Examiner*—Jeffrey A. Gaffin
*Attorney, Agent, or Firm*—Sandler, Greenblum & Bernstein

[57] ABSTRACT

A multilayer identification card containing an IC module in a cavity. The cavity is filled with a polymer with a consistency ranging from liquid to pasty before the card compound is laminated using pressure and heat. During lamination, the polymer completely fills in the cavity around the IC module, supported by the applied pressure. In the finished card, the polymer is cross-linked to form a solid, rubber-like mass, which protects the IC module in the cavity of the card.

14 Claims, 3 Drawing Sheets

IDENTIFICATION CARD WITH INTEGRATED CIRCUIT

This is a continuation of application Ser. No. 07/053,040 filed May 22, 1987, now U.S. Pat. No. 4,843,225 issued on June 27, 1989 which is in turn a divisional application of Ser. No. 06/910,351 filed Sept. 24, 2986, now U.S. Pat. No. 4,746,392 issued on May 24, 1988 which is in turn a continuation under 37 C.F.R. 1.62 of application Ser. No. 06/562,217 filed Dec. 16, 1983, now abandoned.

The present invention relates to a multilayer identification card having an IC module arranged on a carrier element, the IC module being disposed in a cavity in the card and surrounded by elastic material.

An identification card in which the integrated circuit in a cavity in the card is partially surrounded by an elastic embedding mass is described, for example, in German Offenlegungsschrift 22 20 721. In this known card, the circuit is surrounded only on three sides by an elastic mass, while the leads and connection points of the leads are rigidly fixed to the circuit in the card body. When the card is bent, the connection points between the leads and the circuit are thus especially endangered German Offenlegungsschrift 22 20 721 explains, as far as the production of the identification card is concerned, that the circuit may be embedded, for example, in the polyvinyl chloride used in the production of the card. Compared to the sensitive components to be embedded, PVC is fairly hard, so that in this case one cannot really speak of "elastic embedding".

Another identification card having an integrated circuit and a method for producing it are disclosed in German Offenlegungsschrift 30 29 939. In the case of this identification card, for example, so-called buffer zones in the form of intermediate layers are provided in the card compound before lamination. These layers have a lower softening point than the films conventionally used in card production and are elastic in a cold state. Even before the full laminating pressure takes effect on the carrier element or the IC module, the layers with a lower softening point soften and fill in the cavities present in the area of the carrier element. In this way, a homogeneous casing is formed around the carrier element, which can then take on the full laminating pressure.

In the case of the identification card proposed in German Offenlegungsschrift 30 29 939, cavities present in the area of the carrier element are filled in, during, or in the initial phase of, the laminating process, with the material of softend card layers additionally present in the laminate. This means that intermediate layers in the form of additional films or coatings, which soften at appropriate low laminating temperatures but must not have any effect, if possible, on the compound of card layers themselves, must be used for the production of the identification cards.

The problem on which the invention is based is to propose an identification card having an integrated circuit and a method of producing it, which avoid the above-mentioned disadvantages. In particular, the incorporation of the carrier element should not be bound to the use of special films.

The problem is solved by the features stated in the claims.

An essential idea of the invention is to use a material for embedding the integrated circuit or the carrier element, whose properties meet both the requirements for card production and those for use of the card.

Before lamination, the cavities present in the area of the carrier element or the IC module and resulting from corresponding recesses in the card construction are filled with a material whose consistency ranges from pasty to liquid. In the following laminating process, the material, due to its low viscosity, spreads into every single existing cavity, no matter how small. This already takes place in the initial phase of the laminating process, in which the card layers are hardly heated. In the course of the process, when the card layers soften and the maximum laminating pressure takes effect, the complete encasing protects the mechanically sensitive areas of the carrier element. Since the material forming the casing is also practically incompressible, the cavity formed by the recess in the card layers retains its shape, so that the relatively hard card material cannot damage the endangered portions of the carrier element.

The cover films do not show any breaks or deformations in the area of the carrier element, either, because the material which fills in the cavity creates a pressure balance due to its consistency. In accordance with the properties of the material and the laminating temperature, the crosslinking or curing process takes place, converting the material into an elastic state either during or after the laminating process. The material which is now resilient and very ductile offers very good protection for the carrier element or the IC module in the course of the daily use of the identification card.

For the identification card according to the invention, no special additional films or layer constructions are necessary for the incorporation of a carrier element or an IC module.

According to more specific embodiments of the invention, there are cavities in the card in the area of the IC module or the carrier element, which are filled in any case by the liquid or pasty material, whereas other cavities are provided to take up any excess material. In these embodiments of the invention it is guaranteed that certain cavities which are important for the functioning of the card are filled by the material which gives protection both during production and during the use of the card. If there is an excess of material, it is forced into areas of the card which are insignificant for the safe incorporation of an IC module.

Further advantages and developments of the invention can be found in the subclaims and the embodiments described in the following.

The figures show:

FIG. 1 an identification card having an IC module on a carrier element

Figure 2:
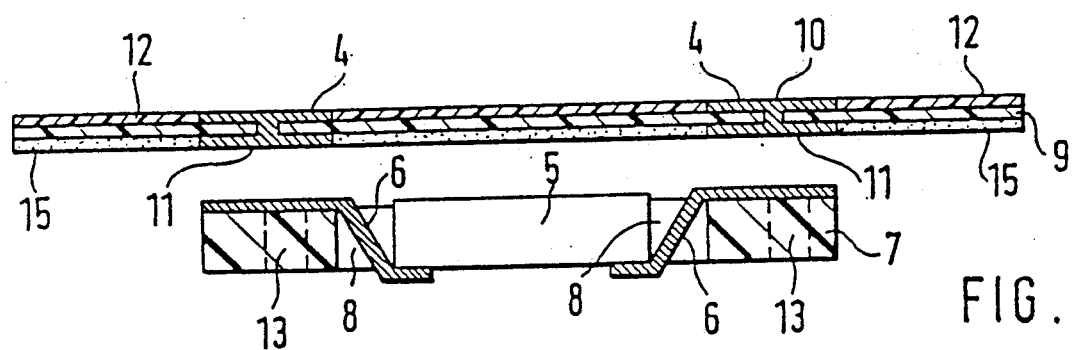

FIG. 2 the single elements of the carrier element used in the identification card of FIG. 1

Figure 3:
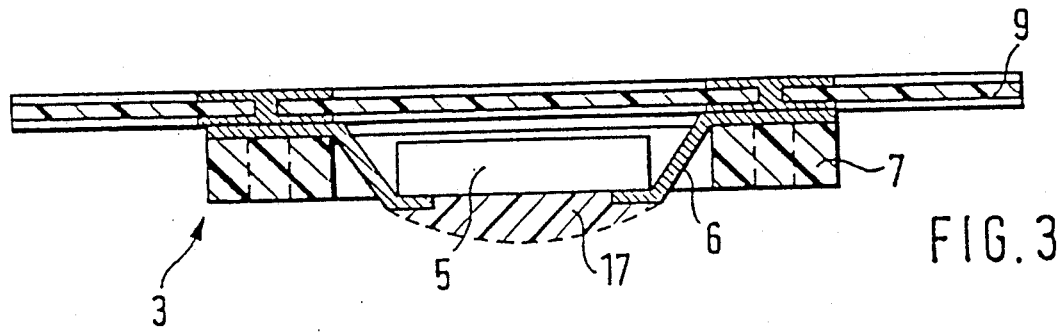
Figure 4:
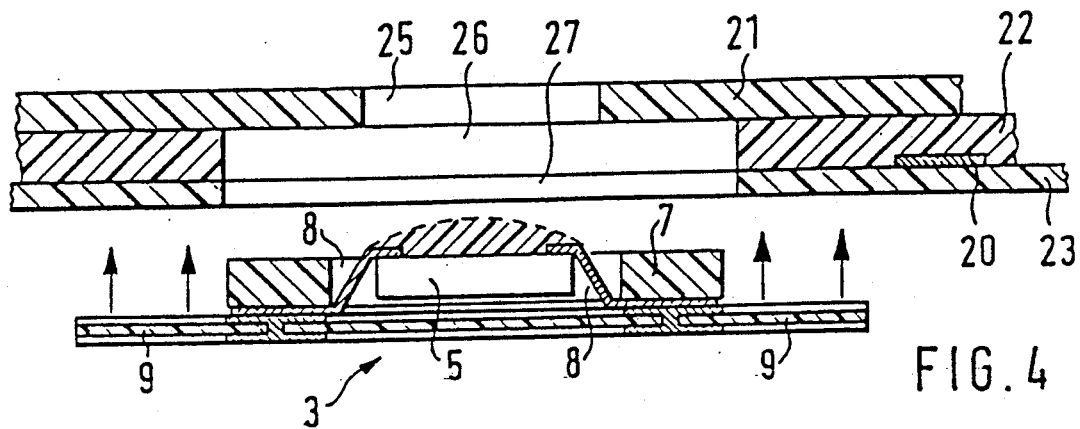
Figure 5:
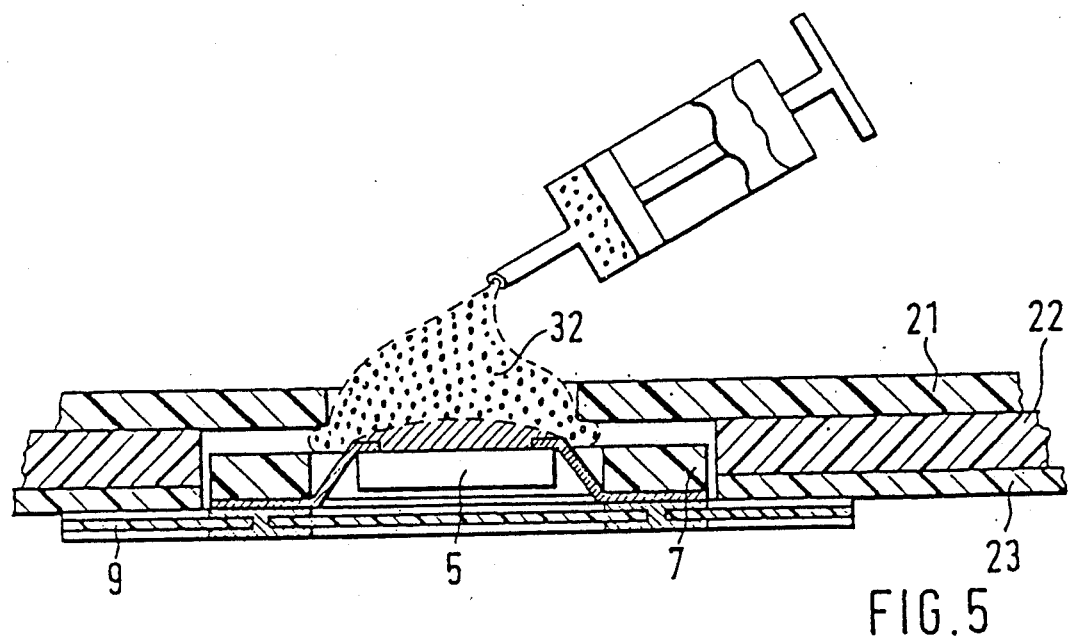
Figure 6:
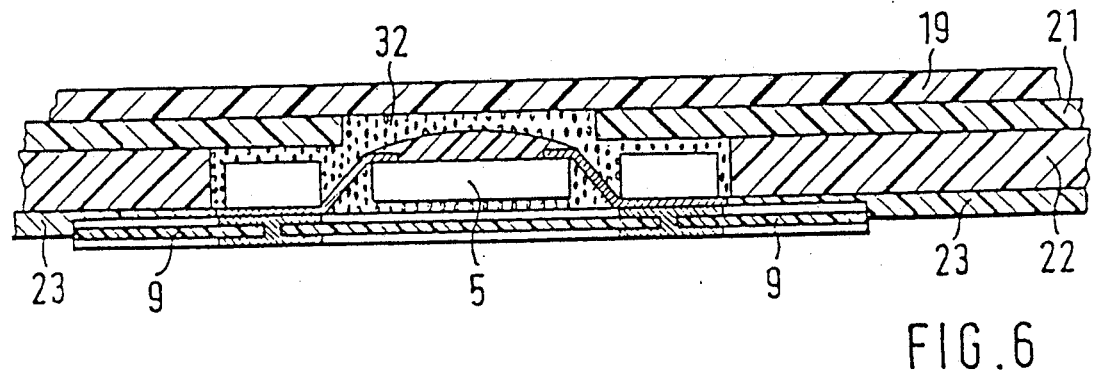
Figure 7:
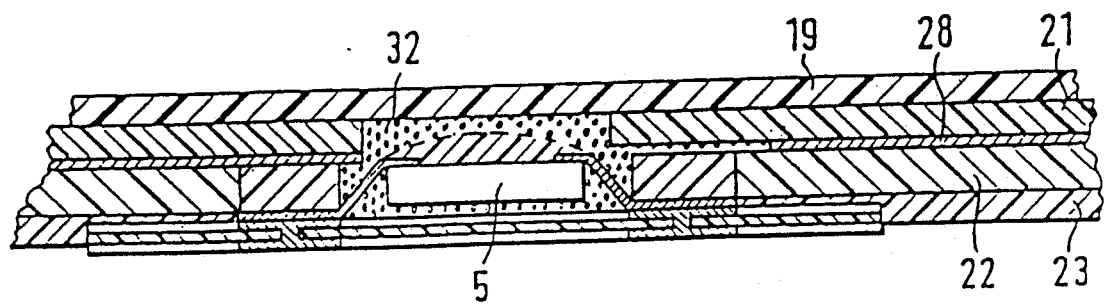
Figure 8:
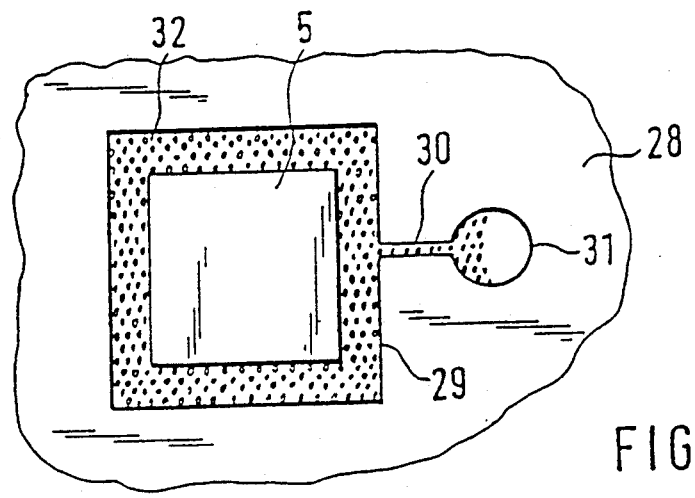
Figure 9:
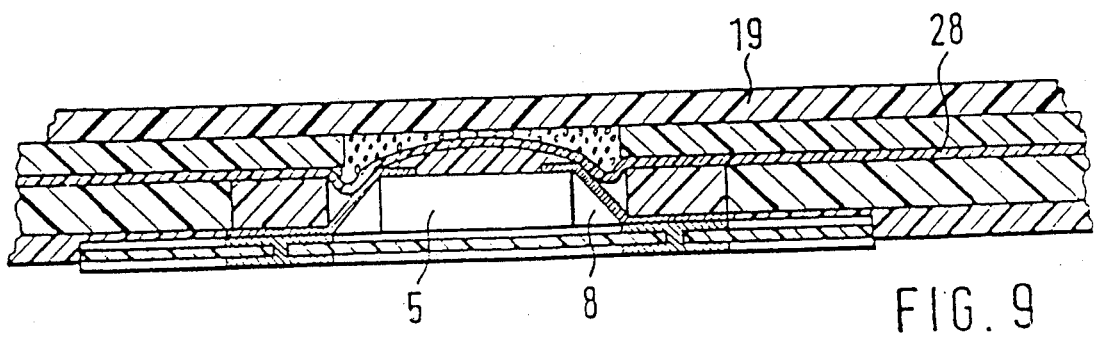

FIG. 3 the single elements of the carrier element of FIG. 2 in an assembled form FIGS. 4,5,6 the method of producing the new card in three procedural phases FIG. 7 an identification card having an additional film to form an equalizing space FIG. 8 the identification card of FIG. 7 from the top FIG. 9 an identification card with a barrier film FIG. 1 shows an identification card 1 having an IC module 5 produced according to the invention. Module 5 is arranged on a carrier element 3 which shall be described in more detail below. On the surface of the carrier element there are contact surfaces 4 allowing for communication with the IC module. The card may be additionally equipped with a magnetic stripe 2 on the back.

In the arrangement of the elements selected in FIG. 1 IC module 5 or carrier element 3 and magnetic stripe 2 are located in the same area of the card. This arrangement is advantageous when the card surface remaining below the magnetic stripe is intended to be entirely reserved for embossed characters. The incorporation of a carrier element is especially critical in the case of identification cards having magnetic stripes and the arrangement of the elements shown in FIG. 1 because the embedding of a carrier element of the above-mentioned type creates inhomogeneity in the compound of the card layers. This inhomogeneity involves, depending on the incorporation technique, greater or lesser deformation of the card layers and thus also of the card surfaces in the area of the carrier element. Deformation in the area of the magnetic stripe is only permitted within very narrow tolerances, in order to guarantee the necessary legibility of the data on the stripe. As shall be shown below, the inventive method also yields good results with respect to this problem.

Before the new method of producing an identification card having an integrated circuit is described in more detail, the construction of the above-mentioned carrier element shall be described. IC module 5 and contact surfaces 4 are part of this carrier element 3, as shown in an embodiment in FIG. 2. The carrier element essentially comprises two films 7 and 9, which are shown separated from each other in FIG. 2 in the interests of clarity. The IC module is arranged in a window 8 in a first film 7 and connected with leads 6 here. The leads end on film 7. This manner of contacting IC modules is known and is generally termed "tape automated bonding". The second film 9 bears the contact surfaces 4 necessary for communication with the module. These contact surfaces are connected via conductive channels 10 with other conductive surfaces 11 located on the opposite side of film 9 with respect to contact surfaces 4. Film 9, which is made of a flexible material, e.g. polyimide, may partially bear, on the contact surface 4 side, a varnish layer 12 which equalizes the thickness of the contact surfaces. To produce the carrier element, films 7 and 9 are put together and leads 6 of film 7 are connected to the conductive surfaces 11 of film 9, e.g. by a soldering process. For this purpose film 7 may be provided in the area of the leads with recesses 13 allowing for the supply of heat to the soldering joints. The finished carrier element 3 is shown in FIG. 3. Since film 9 does not compound with the card materials conventionally used in the production of identification cards, a laminating adhesive 15 is applied to the side of the film later connected with the card material. The exposed side of the integrated circuit 5 may also be covered by a drop of varnish 17 to protect the circuit as well as the contact points of the leads with the circuit from mechanical stress.

FIGS. 4, 5 and 6 show the production of an identification card having an integrated circuit in three procedural phases with reference to an embodiment. Each figure only shows the section of the card in the area of the carrier element, since it is of interest in this connection First, films 21, 22 and 23 with prepared recesses 25, 26 and 27 are put together. Whereas recesses 26, 27 approximately fit the dimensions of film 7 of carrier element 3, the size of recess 25 corresponds approximately to that of window 8 in film 7 in which the integrated circuit is arranged. Film 22 may be provided on one or both sides with a printed pattern 20 which is protectively covered by a transparent film, in this example film 23. Carrier element 3 is now inserted in its correct position in the layer construction shown in FIG. 4. In this embodiment, film 9 of the carrier element is then connected all around its edge with film 23 of the layer series, e.g. by aid of a soldering device, in order to fix the position of the carrier element for the following procedural steps. As may be seen in FIG. 5, the various layer thicknesses are selected in such a way that there are spaces between film of the carrier element and adjacent film 21.

In a subsequent working step the cavities remaining in the layer series even after the carrier element has been incorporated are filled in by a regulated quantity of material 32 with a consistency ranging from liquid to pasty (FIG. 5).

A material which is appropriate according to the invention is, for example, the silicon rubber known by the name of "Sylgard 186 Elastomer" (Dow Corning Company). This is a castable two-component material of medium viscosity which cross-links, after the components are mixed, to form a solid rubber-like mass more or less quickly depending of the heat applied. Depending on the degree of viscosity the cavities present in the area of the carrier element are filled in completely or only partially before lamination, in accordance with their size and accessibility.

The layer construction prepared as in FIG. 5 and filled in with silicon is now pressed together under the effects of heat and pressure after it has been covered by a further film 19 on the open side opposite the carrier element.

In the initial phase of the process the material of low viscosity, due to the layers being pressed together, penetrates all cavities in the area of the carrier element, filling them in without a gap even when they are only accessible via very narrow channels. Since film 9 of carrier element, 3 is soldered all the way around to film 23 of the layer construction, the silicon, which is still liquid, cannot escape from the layer construction at the side of the carrier element. Even before the card layers have softened, the liquid material has encased the carrier element and the integrated circuit. In the course of the process, when the softened card layers are pressed into the final card thickness, the silicon prevents the sensitive parts of the carrier element from being damaged, creating at the same time a pressure balance due to its consistency which is still incompressible. This pressure balance assures that the original recesses in the card layers are more or less retained and the film layers stabilized as a whole, as far as their shape is concerned. Breaks and depressions are avoided, especially on the surface of film 19. It is thus also possible to arrange the magnetic stripe of a card in the area of the carrier element without the unevenness permissible for the magnetic stripe being exceeded.

The finished identification card with an embedded carrier element is shown in FIG. 6. Depending on the properties of the filler and the conditions when the layers are pressed together, the material, originally liquid, crosslinks after an appropriate time period to form a solid elastic mass. Due to this property, the carrier element with its sensitive components, elastically encased in this way, is optimally protected even when the card is subjected to daily use.

As already mentioned, the quantity of the filler is regulated in such a way that the cavities present in the area of the carrier element are completely filled in. Since the volume of all cavities varies from card to card due to production tolerances for the single elements, the complete filling in of all cavities is only guaranteed when an excess of material is used to fill the cavities before lamination. This excess may penetrate between the single card layers in the area of carrier element without causing any disturbance in the card construction or interfering with the functioning or appearance of the card. However, it is also possible to create cavities selectively for any excess material which may be present, which are filled in entirely or only partially depending on the amount of material. For this purpose, a further film 28 is provided in the layer construction of the card, as shown in FIG. 7, this film being arranged between films 21, 22 of the layer constructions described above. The top view shown in FIG. 8 reveals that the additional film has a punched out area in which a punched hole 29 fitting circuit 5 is connected via a channel 30 with a second punched hole 31, which is circular in this embodiment. Arranged between films 21, 22, punched hole 31 becomes an equalizing space into which any excess material may flow. Channel 30 leading to recess 31 has a cross-section such that it only allows embedding material to flow through when the other cavities in the area of the carrier element have been filled in.

FIG. 9 shows a further embodiment in which the additional barrier film 28 does not exhibit any punched out areas. Depending on the amount of the excess material, the film is pressed a certain distance into recess 8. When a closed film is used, the material selected to embed the circuit is kept away from the circuit itself. It is thus possible in this application to use materials which must not come in contact with the circuit or the leads, e.g. electrically conductive or chemically aggressive substances. The space between film 19 and barrier film 28 is in any case completely filled in by the elastic embedding material, while the space in which the circuit is located is filled in depending on the excess material. Barrier film 28 not only has the effect described, but also has the function of preventing the polymer, which is initially liquid, from penetrating to the other side of the card, or from running out of the card construction. The barrier film acts in this case as an additional sealing means, hermetically sealing the inside.

During the laminating process barrier film 28 may be greatly extended, which is no problem if the film is thin enough. However, the deformation may also be reduced, for example, by a cross cut in the film or a window above the IC module. In this case, due to the cut, the embedding material also penetrates into the area of the integrated circuit, depending on the excess. In this case, the barrier film prevents the material only from flowing out of the card construction.

What is claimed is:
1. A multilayer card construction comprising:
   (a) at least one layer having an opening for accommodating an IC module;
   (b) at least one layer having space for receiving elastic material;
   (c) an IC module positioned in said opening; and
   (d) an elastic material filling at least a portion of said space for receiving elastic material in an amount effective for protecting said IC module and minimizing disturbance in said card construction.
2. The multilayer card construction of claim 1, wherein said space for receiving elastic material comprises an area of said opening between said IC module and said at least one layer.
3. The multilayer card construction of claim 2, wherein said area of said opening between said IC module and said at least one layer is at least partially filled with said elastic material.
4. The multilayer card construction of claim 3, wherein said space for receiving elastic material comprises an equalizing space for an amount of elastic material in excess of said amount effective for protecting said IC module.
5. The multilayer card construction of claim 4, wherein said equalizing space is at least partially filled with elastic material.
6. The multilayer card construction of claim 5, wherein said space for receiving elastic material comprises a cavity in at least one card layer.
7. The multilayer card construction of claim 6, wherein said at least one card layer having said cavity is in a different card layer than said at least one card layer having said opening.
8. The multilayer card construction of claim 7, wherein said cavity is substantially filled with said elastic material.
9. The multilayer card construction of claim 8, wherein said equalizing space and said area of said opening between said IC module and said at least one card layer are in the same at least one card layer.
10. The multilayer card construction of claim 9, wherein said equalizing space is in communication with said area of said opening between said IC module and said at least one card layer.
11. The multilayer card construction of claim 10, wherein said equalizing space comprises said area of said opening between said IC module and said at least one layer.
12. The multilayer card construction of claim 10, wherein said equalizing space is remote from said open area between said IC module and said at least one card layer.
13. The multilayer card construction of claim 12, wherein said remote equalizing space is a hollow area.
14. The multilayer card construction of claim 13, wherein said area of said opening between said IC module and said at least one card layer is substantially filled with said elastic material.

* * * * *